United States Patent
Lee et al.

(10) Patent No.: US 10,611,937 B2
(45) Date of Patent: Apr. 7, 2020

(54) COMPOSITION FOR ADHESION, STACKED STRUCTURE USING THE SAME, AND ELECTRONIC DEVICE USING THE SAME

(71) Applicant: Samsung Electronics Co., Ltd., Suwon-si, Gyeonggi-do (KR)

(72) Inventors: Minchul Lee, Seongnam-si (KR); Namil Koo, Hwaseong-si (KR); Kyungrim Kim, Anyang-si (KR); Sun-Woo Park, Anyang-si (KR); Yongin Park, Seoul (KR); Min-Woo Lee, Hwaseong-si (KR); Wonhee Choe, Seoul (KR); Hun Rae Kim, Daejeon (KR); Dong-Sel Kim, Incheon (KR); Zeeyoung Lee, Daejeon (KR)

(73) Assignees: Samsung Electronics Co., Ltd., Gyeonggi-do (KR); GAEMA TECH, Daejeon (KR)

( * ) Notice: Subject to any disclaimer, the term of this patent is extended or adjusted under 35 U.S.C. 154(b) by 69 days.

(21) Appl. No.: 15/933,630

(22) Filed: Mar. 23, 2018

(65) Prior Publication Data
US 2018/0273816 A1 Sep. 27, 2018

(30) Foreign Application Priority Data

Mar. 24, 2017 (KR) .......................... 10-2017-0037821
Sep. 28, 2017 (KR) .......................... 10-2017-0126228

(51) Int. Cl.
| | | |
|---|---|---|
| C09J 183/10 | (2006.01) | |
| C09J 133/06 | (2006.01) | |
| C08J 3/24 | (2006.01) | |
| H01L 21/02 | (2006.01) | |
| C08K 3/36 | (2006.01) | |
| C08F 20/18 | (2006.01) | |
| C08F 220/18 | (2006.01) | |
| C09J 133/08 | (2006.01) | |

(52) U.S. Cl.
CPC ............ *C09J 183/10* (2013.01); *C08F 20/18* (2013.01); *C08F 220/18* (2013.01); *C08J 3/246* (2013.01); *C08K 3/36* (2013.01); *C09J 133/06* (2013.01); *C09J 133/08* (2013.01); *H01L 21/02118* (2013.01); *C08F 2500/01* (2013.01); *C08K 2201/011* (2013.01)

(58) Field of Classification Search
CPC ............ C08F 2220/1808; C08F 220/18; C08F 220/14; C08F 220/12; C08F 220/20; C08F 220/16; C08F 220/1808; C08F 220/1816; C08F 220/1825; C08F 220/1833; C08G 77/045; C08G 77/04; C08G 77/18; C08G 2170/00; C08G 2170/20; C08G 2170/40; C08L 33/066; C08L 83/06; C08L 2203/20; H01L 21/02118; C07D 303/48; C07F 7/1804

See application file for complete search history.

(56) References Cited

U.S. PATENT DOCUMENTS

| | | | |
|---|---|---|---|
| 6,872,765 B1 * | 3/2005 | Betz ..................... | B05D 7/536 |
| | | | 524/236 |
| 9,310,946 B2 | 4/2016 | Lin et al. | |
| 9,483,150 B2 | 11/2016 | Chung | |
| 2010/0104879 A1 * | 4/2010 | Okano .................. | G02B 1/105 |
| | | | 428/447 |
| 2011/0234529 A1 | 9/2011 | Lee et al. | |
| 2012/0062504 A1 | 3/2012 | Kim et al. | |
| 2014/0262002 A1 * | 9/2014 | Suwa ....................... | C09J 7/00 |
| | | | 156/249 |
| 2015/0346872 A1 | 12/2015 | Hwang et al. | |

FOREIGN PATENT DOCUMENTS

| | | | |
|---|---|---|---|
| JP | H 09-131842 | * | 5/1997 |
| JP | 2014-162835 | * | 9/2014 |
| JP | 2015-187186 | * | 10/2015 |
| KR | 10-2012-0065009 A | | 6/2012 |
| KR | 10-2015-0107320 A | | 9/2015 |
| KR | 10-2016-0009773 A | | 1/2016 |

OTHER PUBLICATIONS

Translation of JP 2014-162835 (Year: 2014).*
Translation of JP 2015-187186 (Year: 2015).*
Translation of JPH 09-131842 (Year: 1997).*

* cited by examiner

*Primary Examiner* — Robert C Boyle
(74) *Attorney, Agent, or Firm* — Harness, Dickey & Pierce, P.L.C.

(57) ABSTRACT

Provided are a composition for adhesion, a stacked structure including the same, and an electronic device including the same. The composition for adhesion may include an acrylic resin and a silane compound. The acrylic resin may have a weight average molecular weight of about 100,000 g/mol to about 200,000 g/mol, and may include a polymerization unit derived from a monomer represented by Formula A1 and a polymerization unit derived from a monomer represented by Formula A2. The silane compound may have a weight average molecular weight of about 300 g/mol to about 2,000 g/mol, and a polymerization unit derived from a monomer represented by Formula B.

20 Claims, 7 Drawing Sheets

COMPOSITION FOR ADHESION, STACKED STRUCTURE USING THE SAME, AND ELECTRONIC DEVICE USING THE SAME

CROSS-REFERENCE TO RELATED APPLICATIONS

This U.S. non-provisional patent application claims priority under 35 U.S.C. § 119 to Korean Patent Application Nos. 10-2017-0126228 and 10-2017-0037821, filed on Sep. 28, 2017 and Mar. 24, 2017, respectively, the entire contents of each of the foregoing applications are hereby incorporated by reference.

BACKGROUND

The present disclosure herein relates to a composition for adhesion, an adhesion layer using the same, and a stacked structure and an electronic device including the adhesion layer.

A touch sensing device is a sensor for sensing touch, and a fingerprint sensing device is a sensor for sensing human fingerprints. Recently, touch sensing devices and fingerprint sensing devices are widely used in a laptop, a mobile device such as a cellular phone. Touch sensing devices and fingerprint sensing devices are classified as an ultrasonic wave type, infrared type, electrostatic capacity type, etc. according to operation principle. Research for improving the reliability and sensitivity of the touch sensing devices and the fingerprint sensing devices is receiving attention.

SUMMARY

The present disclosure provides a composition for adhesion, having improved adhesion strength and durability.

The present disclosure also provides a miniaturized electronic device having improved durability.

According to some example embodiments of inventive concepts, a composition for adhesion includes an acrylic resin and a silane compound. The acrylic resin has a weight average molecular weight of about 100,000 g/mol to about 200,000 g/mol and includes a polymerization unit derived from a monomer represented by Formula A1 and a polymerization unit derived from a monomer represented by Formula A2. The silane compound has a weight average molecular weight of about 300 g/mol to about 2,000 g/mol and includes a polymerization unit derived from a monomer represented by Formula B.

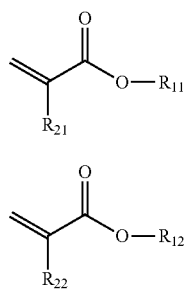

[Formula A1]

[Formula A2]

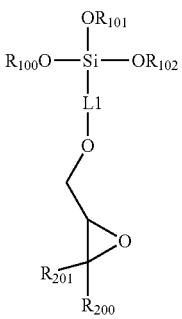

[Formula B]

In Formula A1, $12_n$ is a hydroxyalkyl group of 1 to 6 carbon atoms, and $R_{21}$ is hydrogen, deuterium, or an alkyl group of 1 to 3 carbon atoms. In Formula A2, $R_{12}$ is an alkyl group of 1 to 6 carbon atoms, and $R_{22}$ is hydrogen, deuterium, or an alkyl group of 1 to 3 carbon atoms. In Formula B, $R_{100}$, $R_{101}$, and $R_{102}$ are each independently an alkyl group of 1 to 6 carbon atoms; $R_{200}$ and $R_{201}$ are each independently one of hydrogen, deuterium or an alkyl group of 1 to 3 carbon atoms; and $L_1$ is a single bond or an alkyl group of 1 to 4 carbon atoms.

In some example embodiments of inventive concepts, a composition for adhesion includes an acrylic resin and a silane compound. The silane compound includes a polymerization unit represented by Formula 1. The acrylic resin is represented by Formula 4.

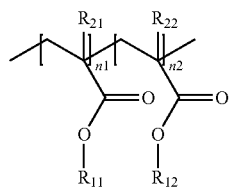

[Formula 1]

In Formula 1, $R_{11}$ is a hydroxyalkyl group of 1 to 6 carbon atoms; $R_{12}$ is an alkyl group of 1 to 6 carbon atoms; $R_{21}$ and $R_{22}$ are each independently hydrogen, deuterium or an alkyl group of 1 to 3 carbon atoms; and n1 and n2 are each independently an integer in a range greater than or equal to 1 and less than or equal 2,000.

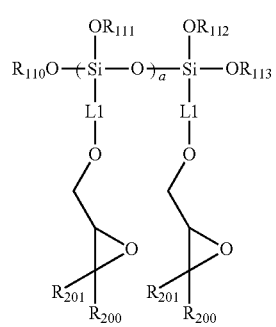

[Formula 4]

In Formula 4, $R_{110}$, $R_{111}$, $R_{112}$, and $R_{113}$ are each independently an alkyl group of 1 to 6 carbon atoms; $R_{200}$ and $R_{201}$ are each independently one of hydrogen, deuterium, or an alkyl group of 1 to 3 carbon atoms; $L_1$ is a single bond or an alkyl group of 1 to 4 carbon atoms; and a is an integer of 1 to 6.

In some example embodiments of inventive concepts, an electronic device includes a substrate; a sensing film on the substrate; and an adhesion layer on the sensing film. The adhesion layer includes a cured product of a composition for adhesion. The composition for adhesion includes an acrylic resin and a silane compound. The acrylic resin has a weight average molecular weight of about 100,000 g/mol to about 200,000 g/mol and includes a polymerization unit derived from a monomer represented by Formula A1 and a polymerization unit derived from a monomer represented by Formula A2. The silane compound has a weight average molecular weight of about 300 g/mol to about 2,000 g/mol and includes a polymerization unit derived from a monomer represented by Formula B. The silane compound represented by Formula 4.

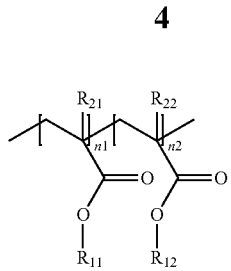

[Formula 1]

In Formula 1, $R_{11}$ is a hydroxyalkyl group of 1 to 6 carbon atoms; $R_{12}$ is an alkyl group of 1 to 6 carbon atoms; $R_{21}$ and $R_{22}$ are each independently hydrogen, deuterium or an alkyl group of 1 to 3 carbon atoms; and n1 and n2 are each independently an integer in a range greater than or equal to 1 and less than or equal 2,000.

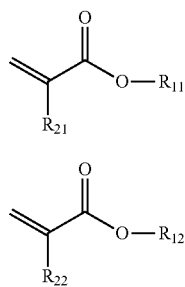

[Formula A1]

[Formula A2]

In Formula A1, $R_{11}$ is a hydroxyalkyl group of 1 to 6 carbon atoms, and $R_{21}$ is hydrogen, deuterium, or an alkyl group of 1 to 3 carbon atoms. In Formula A2, $R_{12}$ is an alkyl group of 1 to 6 carbon atoms, and $R_{22}$ is hydrogen, deuterium, or an alkyl group of 1 to 3 carbon atoms.

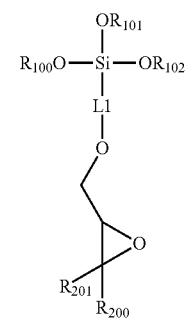

[Formula B]

In Formula B, $R_{100}$, $R_{101}$, and $R_{102}$ are each independently an alkyl group of 1 to 6 carbon atoms; $R_{200}$ and R201 are each independently one of hydrogen, deuterium and an alkyl group of 1 to 3 carbon atoms; and L1 is a single bond or an alkyl group of 1 to 4 carbon atoms.

In some example embodiments of inventive concepts, a stacked structure includes an organic layer on a substrate, an inorganic layer on the organic layer, and an adhesion layer between the organic layer and the inorganic layer. The adhesion layer includes a cured product of a composition for adhesion. The composition for adhesion includes an acrylic resin including a polymerization unit represented by Formula 1, a silane compound represented by Formula 4, and silica nanoparticles.

[Formula 4]

In Formula 4, $R_{110}$, $R_{111}$, $R_{112}$, and $R_{113}$ are each independently an alkyl group of 1 to 6 carbon atoms; $R_{200}$ and $R_{201}$ are each independently one of hydrogen, deuterium, or an alkyl group of 1 to 3 carbon atoms; $L_1$ is a single bond or an alkyl group of 1 to 4 carbon atoms; and a is an integer of 1 to 6.

BRIEF DESCRIPTION OF THE FIGURES

The accompanying drawings are included to provide a further understanding of inventive concepts, and are incorporated in and constitute a part of this specification. The drawings illustrate some example embodiments of inventive concepts and, together with the description, serve to explain principles of inventive concepts. In the drawings.

DETAILED DESCRIPTION

Figure 1:
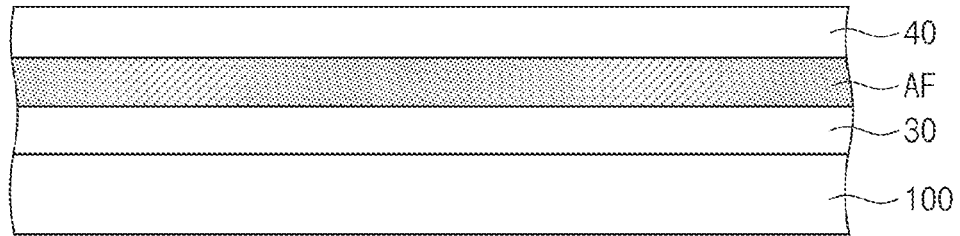
FIG. 1 is a cross-sectional view showing a stacked structure according to some example embodiments.

In the present disclosure, an alkyl group may be a linear alkyl group, a branched alkyl group, or a cyclic alkyl group. The carbon number of the alkyl group is not specifically limited, but the alkyl group may have 1 to 6 carbon atoms. Examples of the alkyl group may include methyl, ethyl, n-propyl, isopropyl, n-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, and n-hexyl, without limitation.

In the present disclosure, a hydroxyalkyl group may mean an alkyl group of which hydrogen is substituted with a hydroxyl group. The carbon number of the hydroxylalkyl group is not specifically limited, but may be 1 to 6. The hydroxyl group of the hydroxylalkyl group may include a primary alcohol, a secondary alcohol and a tertiary alcohol.

In the present disclosure, the carbon number of an alkoxy group is not specifically limited, but may be 1 to 6. The alkoxy group may include an alkyl alkoxy group and an aryl alkoxy group.

In the present disclosure, a silyl group includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl and phenylsilyl, without limitation.

In the present disclosure, "substituted or unsubstituted" may mean substituted or unsubstituted with at least one substituent selected from the group consisting of a hydrogen atom, a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocycle group. In detail, "substituted or unsubstituted" may mean substituted or unsubstituted with at least one substituent selected from the group consisting of a hydrogen atom, a deuterium atom, an alkyl group, a hydroxyl group, an alkoxy group, an epoxy group, and a silyl group. In addition, each of the exemplified substituents may be substituted or unsubstituted. For example, a methyl silyl group may be interpreted as the silyl group.

In the formulae of the present disclosure, an absence of a chemical bond where a chemical bond is required to be may mean a bond with a hydrogen atom, unless otherwise defined.

Hereinafter, a composition for adhesion according to inventive concepts will be explained.

According to inventive concepts, the composition for adhesion may include an acrylic resin, a silane compound, and silica nanoparticles. An adhesion layer may be formed using the composition for adhesion, and the adhesion layer may be used in an electronic device.

Silica nanoparticles may have a diameter of about 20 nm to about 60 nm. An adhesion layer may include the silica nanoparticles, and the strength of the adhesion layer may be enhanced.

The acrylic resin may have a weight average molecular weight of about 100,000 g/mol to about 200,000 g/mol. The acrylic resin may be prepared by the polymerization of acrylate monomers. In this case, a polymerization initiator such as dibenzoyl peroxide (DBPO) may be used. According to some example embodiments, the acrylic resin may be prepared by the polymerization reaction of an acrylate monomer represented by Formula A1 below and an acrylate monomer represented by Formula A2 below. For example, the acrylic resin may be prepared by the polymerization of 2-hydroxyethyl methacrylate and butyl acrylate. Accordingly, the acrylic resin may include a polymerization unit derived from an acrylate monomer of Formula A1 and a polymerization unit derived from an acrylate monomer of Formula A2. The polymerization unit derived from the acrylate monomer of Formula A1 and the polymerization unit derived from the acrylate monomer of Formula A2 may be represented by the following Formula 1:

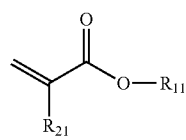

[Formula A1]

In Formula A1, $12_{11}$ is a hydroxyalkyl group of 1 to 6 carbon atoms, and $R_{21}$ is hydrogen, deuterium, or an alkyl group of 1 to 3 carbon atoms.

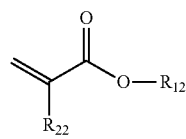

[Formula A2]

In Formula A2, $R_{12}$ is an alkyl group of 1 to 6 carbon atoms, and $R_{22}$ is hydrogen, deuterium, or an alkyl group of 1 to 3 carbon atoms.

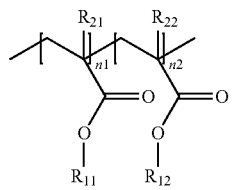

[Formula 1]

In Formula 1, $R_{11}$ may be a hydroxyalkyl group of 1 to 6 carbon atoms, $R_{12}$ may be an alkyl group of 1 to 6 carbon atoms, $R_{21}$ and $R_{22}$ are each independently hydrogen, deuterium or an alkyl group of 1 to 3 carbon atoms. n1 and n2 are each independently an integer in a range greater than or equal to 1 and less than or equal 2,000, and n1:n2 may be from about 1:9 to about 9:1.

According to some example embodiments, the acrylic resin may be prepared by further polymerizing at least one of an acrylate monomer represented by Formula A3 or an acrylate monomer represented by Formula A4, in addition to the acrylate monomer represented by Formula A1 and the acrylate monomer represented by Formula A2.

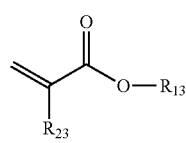

[Formula A3]

In Formula A3, $R_{13}$ is a bicyclic alkyl group of 5 to 15 carbon atoms, and $R_{23}$ is hydrogen, deuterium, or an alkyl group of 1 to 3 carbon atoms.

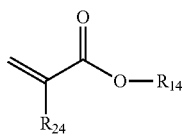

[Formula A4]

In Formula A4, $R_{14}$ is an alkyl group of 1 to 6 carbon atoms, and $R_{24}$ is hydrogen, deuterium, or an alkyl group of 1 to 3 carbon atoms.

According to some example embodiments, R14 of Formula A4 may be different from R12 of Formula A1.

The acrylic resin may further include at least one of a polymerization unit derived from the acrylate monomer represented by Formula A3 or a polymerization unit derived from the acrylate monomer represented by Formula A4, in addition to the polymerization unit derived from the acrylate monomer represented by Formula A1 and the polymerization unit derived from the acrylate monomer represented by Formula A2. The polymerization unit derived from the acrylate monomer of Formula A3 may be represented by the following Formula 2-1. The polymerization unit derived from the acrylate monomer of Formula A4 may be represented by the following Formula 2-2:

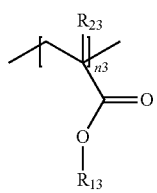

[Formula 2-1]

In Formula 2-1, $R_{13}$ is a bicyclic alkyl group of 5 to 15 carbon atoms, and $R_{23}$ is hydrogen, deuterium, or an alkyl group of 1 to 3 carbon atoms, and n3 is an integer in a range greater than or equal to 1 and less than or equal 2,000.

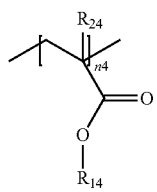

[Formula 2-2]

In Formula 2-2, $R_{14}$ is an alkyl group of 1 to 6 carbon atoms, and $R_{24}$ is hydrogen, deuterium, or an alkyl group of 1 to 3 carbon atoms, and n4 is an integer in a range greater than or equal to 1 and less than or equal 2,000.

The acrylic resin may include a polymerization unit represented by Formula 3.

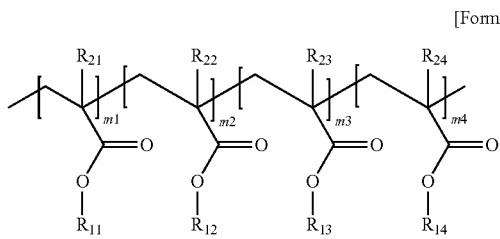

[Formula 3]

In Formula 3, one of $R_{11}$, $R_{12}$, $R_{13}$, and $R_{14}$ may be a hydroxyalkyl group of 1 to 6 carbon atoms, another one thereof may be an alkyl group of 1 to 6 carbon atoms, another one thereof may be a bicyclic alkyl group of 5 to 15 carbon atoms, and the remaining one may be an alkyl group of 1 to 6 carbon atoms. $R_{21}$, $R_{22}$, $R_{23}$, and $R_{24}$ may be each independently one of hydrogen, deuterium, and an alkyl group of 1 to 3 carbon atoms, and m1, m2, m3, and m4 are each independently an integer in a range greater than or equal to 1 and less than or equal 2,000.

$R_{11}$, $R_{12}$, $R_{13}$, $R_{14}$, $R_{21}$, $R_{22}$, $R_{23}$, and $R_{24}$ of Formula 3 may be the same as or different from $R_{11}$, $R_{12}$, $R_{13}$, $R_{14}$, $R_{21}$, $R_{22}$, $R_{23}$, and $R_{24}$ of Formulae A1 to A4. Each of $R_{11}$, $R_{12}$, $R_{13}$, $R_{14}$, $R_{21}$, $R_{22}$, $R_{23}$, and $R_{24}$ of Formula 3 may be the same as one of $R_{11}$ of Formula A1, $R_{12}$ of Formula A2, $R_{13}$ of Formula A3, and $R_{14}$ of Formula A4.

In Formula A3, Formula 2-1, and Formula 3, a bicyclic alkyl group may be one of bicycle[2.2.1]heptanyl and the derivatives thereof. The bicyclic alkyl group may be represented by the following Formula A5:

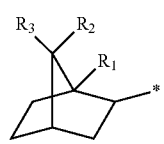

[Formula A5]

In Formula A5, $R_1$, $R_2$, and $R_3$ are each independently one selected from hydrogen, deuterium, and an alkyl group of 1 to 3 carbon atoms. * means a part combined with O of Formula A3, O of Formula 2-1, or O of Formula 3. For example, the bicyclic alkyl group may be an isobornyl group. In this case, $R_1$, R2, and R3 in Formula A5 may be methyl groups.

For example, the acrylic resin of Formula 3 may be prepared by the polymerization reaction of 2-hydroxyethyl methacrylate, butyl acrylate, isobornyl acrylate, and 2-ethylhexyl acrylate.

The silane compound may include a polymerization unit of a material represented by Formula B below. The silane compound may be formed by the polymerization of the material represented by Formula B below. For example, the silane compound may be formed by the polymerization of (3-glycidyloxypropyl) trimethoxysilane. The silane compound may have a weight average molecular weight of about 300 g/mol to about 2,000 g/mol.

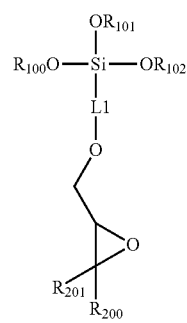

[Formula B]

In Formula B, $R_{100}$, $R_{101}$, and $R_{102}$ are each independently an alkyl group of 1 to 6 carbon atoms, and $R_{200}$ and $R_{201}$ are each independently one of hydrogen, deuterium, and an alkyl group of 1 to 3 carbon atoms. $L_1$ may be a single bond or an alkyl group of 1 to 4 carbon atoms.

The silane compound may be represented by the following Formula 4:

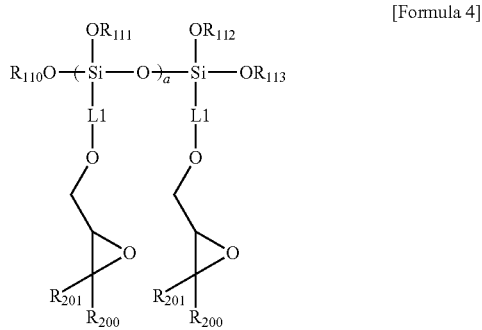

[Formula 4]

In Formula 4, $R_{110}$, $R_{111}$, $R_{112}$, and $R_{113}$ are each independently an alkyl group of 1 to 6 carbon atoms, and $R_{200}$ and $R_{201}$ are the same as defined in Formula B. $L_1$ is a single bond or an alkyl group of 1 to 4 carbon atoms. "a" is an integer of 1 to 6.

The silane compound may have the properties of an organic material and the properties of an inorganic material at the same time. An adhesion layer formed by using a composition for adhesion may show high bonding strength with respect to an organic layer and an inorganic layer.

According to some example embodiments, the weight ratio of the silane compound to the silica nanoparticles may be from about 1:0.3 to about 1:3. The weight ratio of the acrylic resin to a total amount of the silane compound and the silica nanoparticles may be from about 1:1 to about 1:9.

FIG. 1 is a cross-sectional view showing a stacked structure according to some example embodiments. Hereinafter, overlapping parts with the above-explanation will be omitted.

Referring to FIG. 1, a stacked structure may include a substrate 100, an organic layer 30, an adhesion layer AF and an inorganic layer 40. The organic layer 30 may be disposed on the substrate 100. The organic layer 30 may include a polymer or a resin. The inorganic layer 40 may be disposed on the organic layer 30. The inorganic layer 40 may include an inorganic material such as glass and silica. In other embodiments, the substrate 100 may be omitted.

The adhesion layer AF may be interposed between the organic layer 30 and the inorganic layer 40. The adhesion layer AF may be attached to the inorganic layer 40 and the organic layer 30. The inorganic layer 40 may be attached to the organic layer 30 through the adhesion layer AF.

The adhesion layer AF may be prepared using the composition for adhesion. The composition for adhesion may include a plurality of acrylic resins, a plurality of silane compounds, and silica nanoparticles. According to some example embodiments, the formation of the adhesion layer AF may include the supplying of the composition for adhesion between the organic layer 30 and the inorganic layer 40, and the curing of the composition for adhesion. The curing of the composition for adhesion may be performed by photocuring or thermal curing. For example, the photocuring of the composition for adhesion may be performed by the irradiation of ultraviolet rays. The thermal curing of the composition for adhesion may be performed under temperature conditions of about 80° C. to about 200° C. The composition for adhesion may be cured by at least one of forming crosslinking bonds between acrylic resins and silane compounds, forming crosslinking bonds between acrylic resins, or forming crosslinking bonds between silane compounds. Hereinafter, a single acrylic resin and a single silane compound will be explained for the brevity of explanation.

During forming the crosslinking bond, a hydroxyl group (OH) of the acrylic resin may act as a reacting group. The hydroxyl group of the acrylic resin may be derived from an acrylate monomer of Formula A1. For example, the hydroxyl group of the acrylic resin may mean a hydroxyl group of the hydroxyalkyl group represented by R11 in Formula 1. The hydroxyl group, alkoxy group and epoxy group of the silane compound may act as the reacting group. The hydroxyl group or the alkoxy group of the silane compound may be a group represented by —OR110, —OR111, —OR112 or —OR113 in Formula 4, and the epoxy group may be an epoxy group included in a glycidyl oxyalkyl group.

The composition for adhesion includes an acrylic resin, and the adhesion layer AF may show adhesive property. The adhesive property of the adhesion layer AF may be controlled by the functional groups of the acrylic resin. The functional groups may mean R11, R12, R13, and R14 of Formula A1 to Formula A4, Formula 1, Formula 2-1, Formula 2-2, and Formula 3. According to some example embodiments, the kind of the functional groups of the acrylic resin may be controlled, and the adhesion layer AF may have adhesive property to the organic layer 30 and the inorganic layer 40.

Since the silane compound shows the properties of an organic material and the properties of an inorganic material, the adhesion layer AF may show high bonding strength to the inorganic layer 40 as well as the organic layer 30. Accordingly, the inorganic layer 40 may be rigidly fixed to the organic layer 30 by the adhesion layer AF. Since the composition for adhesion includes the silane compound and the silica nanoparticles, the adhesion layer AF may show high bonding strength and heat resistance. Though external stress is applied to the organic layer 30 or the inorganic layer 40, the adhesion layer AF may absorb the stress. The external stress may be external physical impact and/or thermal stress.

Figure 2A:
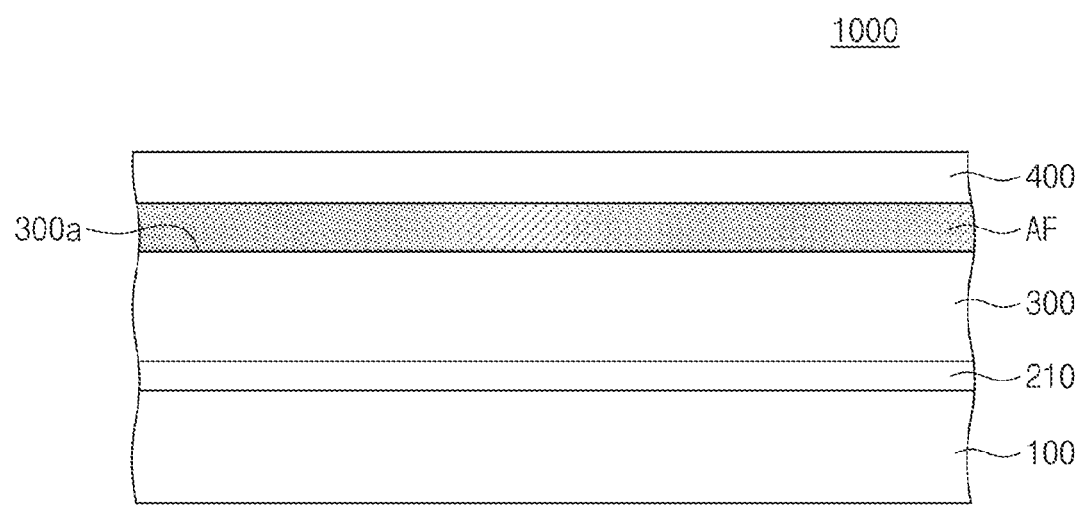
FIG. 2A is a cross-sectional view of a sensing device according to some example embodiments.

FIG. 2A is a cross-sectional view of a sensing device according to some example embodiments. Hereinafter, the descriptions to the same technical features as mentioned above will be omitted or mentioned briefly for the purpose of ease and convenience in explanation.

Referring to FIG. 2A, a sensing device 1000 may include a substrate 100, a first adhesion film 210, a sensing film 300, an adhesion layer AF, and a glass layer 400. The sensing device 1000 may be a fingerprint sensing device or a touch sensing device. The substrate 100 may include, for example, an organic material, and the organic material may include a polymer such as polyimide. In other embodiments, the substrate 100 may include a semiconductor material such as silicon, germanium, and silicon-germanium.

The sensing film 300 may be disposed on the substrate 100. The sensing film 300 may include an organic material. For example, the sensing film 300 may include an insulating polymer. According to some example embodiments, the sensing film 300 may include a plurality of layers, and the uppermost layer of the sensing film 300 may include an organic material such as an insulating polymer, and the uppermost layer may be exposed on the top surface 300a of the sensing film 300. In other embodiments, the sensing film 300 may be formed of a single layer, and the single layer may include an insulating polymer. The sensing film 300 may recognize fingerprint information or touch information of a user. Hereinafter, the sensing film 300 will be explained in more detail.

Figure 3A:
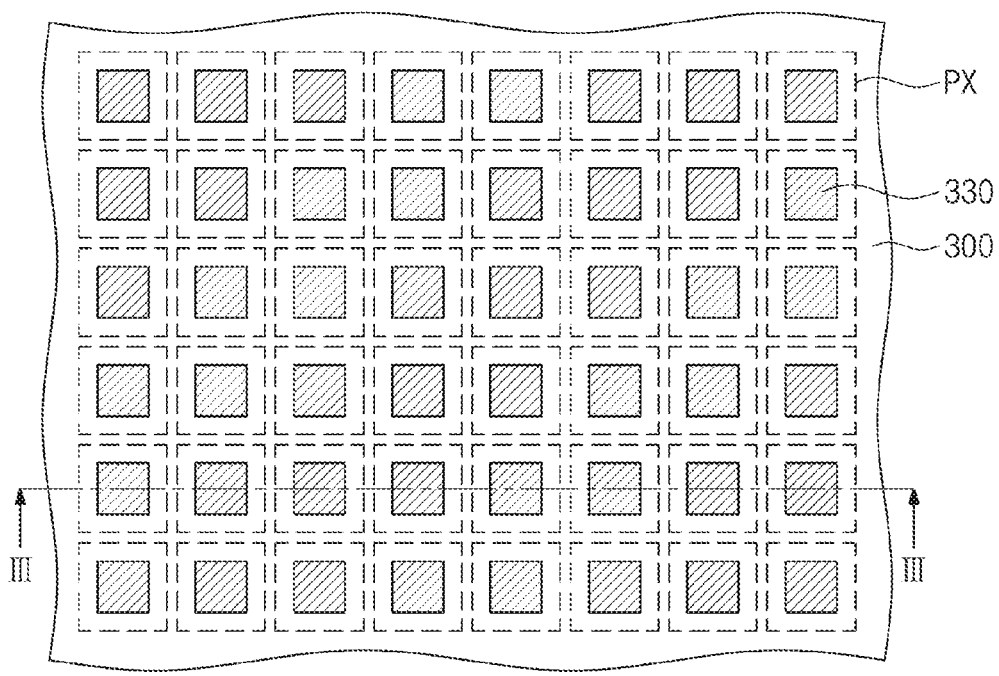
FIG. 3A is a plan view showing a sensing film according to some example embodiments.
Figure 3B:
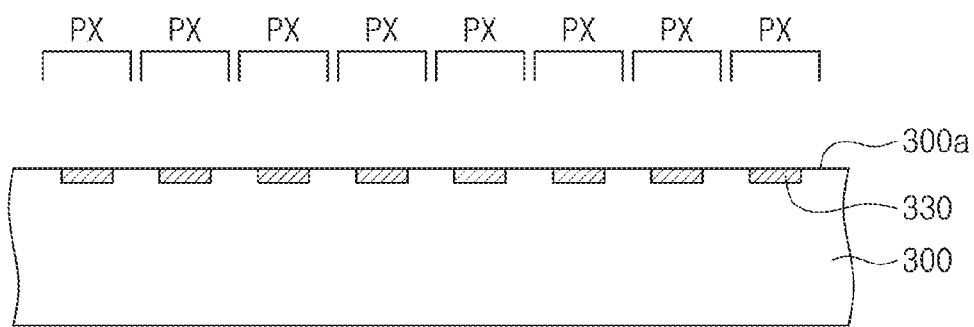
FIG. 3B is a cross-sectional view taken along line III-III of FIG. 3A.

FIG. 3A is a plan view showing a sensing film according to some example embodiments. FIG. 3B is a cross-sectional view taken along line III-III of FIG. 3A.

Referring to FIGS. 3A and 3B, the sensing film 300 may have pixels PX. The pixels PX of the sensing film 300 may function as a user recognition region. As in FIG. 3A, the pixels PX are provided in plural, and may form an array arranged in a two-dimensional structure. In some embodiments, the pixels PX may be arranged in a two-dimensional structure along rows and columns. However, the planar shape and disposition of the array formed by the pixels PX may be variously modified.

Sensing plates 330 may be provided in the pixels PX of the sensing film 300, respectively. The planar arrangement of the sensing plates 330 may correspond to the planar arrangement of the pixels PX of the sensing film 300. However, the arrangement of the sensing plates 330 is not limited thereto. Each of the sensing plates 330 is shown to have a rectangular planar shape, but the planar shape of each of the sensing plates 330 may be variously modified, such as circular, elliptical, or polygonal.

As in FIG. 3B, the sensing plates 330 may be exposed on the top surface 300a of the sensing film 300 or may be provided adjacent to the top surface 300a of the sensing film 300. In other embodiments, the sensing plates 330 may be disposed on the bottom of the sensing film 300. The sensing plates 330 may measure fingerprint information or touch information of a user. For example, the sensing plates 330 may measure the capacitance of the pixels PX. Even not shown, the sensing film 300 may include wirings therein. The wirings may be electrically connected with integrated circuits. The integrated circuits may be provided at the exterior of the sensing device (1000 of FIG. 2A). In other embodiments, the integrated circuits may be provided in the sensing film 300. The integrated circuits may transform the change of capacitance measured in the sensing plates 330 of the pixels PX into electrical signals. In other embodiments, the sensing film 300 may recognize fingerprint/touch information not by an electrostatic capacity method but by an ultrasonic method or an optical method.

Referring to FIG. 2A again, the glass layer 400 may be disposed on the sensing film 300. The glass layer 400 may be clear. The glass layer 400 may include an inorganic material. The glass layer 400 may protect the sensing film 300 from external stress.

The adhesion layer AF may be disposed between the sensing film 300 and the glass layer 400. The adhesion layer AF may be in physical contact with the top surface 300a of the sensing film 300 and the glass layer 400. The adhesion layer AF may be formed using a composition for adhesion as explained above referring to FIG. 1. For example, the composition for adhesion may be supplied between the sensing film 300 and the glass layer 400, and then the composition for adhesion may be cured to form the adhesion layer AF. The curing of the composition for adhesion may include the forming of crosslinking bonds as in the explanation referring to FIG. 1. The curing of the composition for adhesion may be performed by the same method as in the forming method of the adhesion layer AF of FIG. 1.

Since the silane compound shows the properties of an organic material and an inorganic material, the adhesion layer AF may show high bonding strength with respect to the top surface 300a of the sensing film 300 and the glass layer 400. Accordingly, the glass layer 400 may be rigidly bonded to the top surface 300a of the sensing film 300 by the adhesion layer AF. The composition for adhesion includes the silane compound and the silica nanoparticles, and the adhesion layer AF may show high strength and heat resistance. The sensing film 300 may be protected from external stress by the adhesion layer AF and the glass layer 400.

If the glass layer 400 is thick, the delivery of fingerprint/touch information of a user to the sensing film 300 may be a little difficult. According to some example embodiments, the adhesion layer AF is provided, and the thickness of the glass layer 400 may decrease. For example, the glass layer 400 may have a thickness of about 1 mm or less. Accordingly, the sensing sensitivity of the sensing device 1000 may be improved. The adhesion layer AF may deliver fingerprint/touch information of a user to the sensing film 300 relatively satisfactorily. The adhesion layer AF may have a thickness of about 10 μm to about 60 μm. If the thickness of the adhesion layer AF is smaller than about 10 μm, the absorption of external stress of the adhesion layer AF may be difficult. If the thickness of the adhesion layer AF is greater than about 60 μm, the sensing sensitivity of the sensing device 1000 may decrease. The adhesion layer AF may be an insulating film. The adhesion layer AF may be clear.

The first adhesion film 210 may be disposed between the substrate 100 and the sensing film 300. The sensing film 300 may be attached to the substrate 100 by the first adhesion film 210. In some embodiments, the first adhesion film 210 may include an organic material such as a resin. The first adhesion film 210 may include an optical clearance adhesive material. In other embodiments, the first adhesion film 210 may be formed using the composition for adhesion according to some example embodiments. The preparation method and the curing of the first adhesion film 210 may be substantially the same as in the preparation method of the adhesion layer AF of FIG. 1.

Figure 2B:
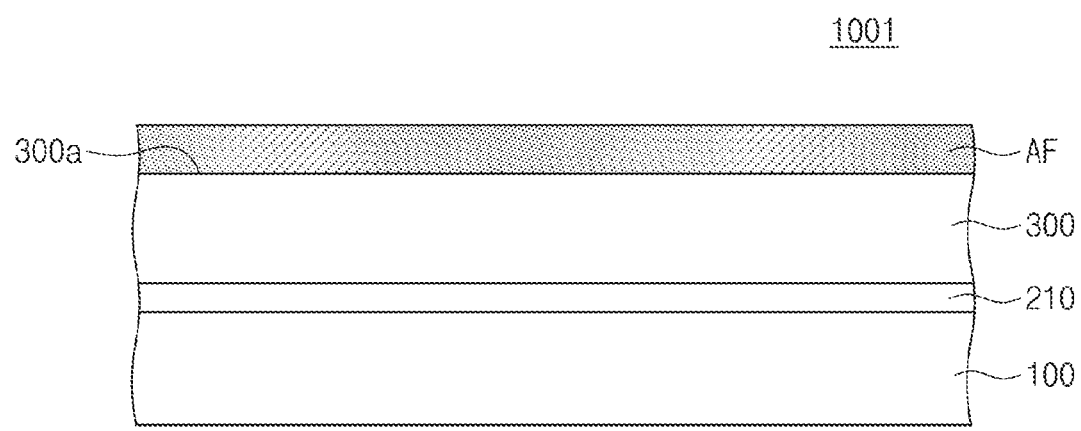
FIG. 2B is a cross-sectional view of a sensing device according to some example embodiments.

FIG. 2B is a cross-sectional view showing a sensing device according to some example embodiments. Hereinafter overlapping parts with the above-explanation will be omitted.

Referring to FIG. 2B, a sensing device 1001 may include a substrate 100, a first adhesion film 210, a sensing film 300, and an adhesion layer AF. The substrate 100, the first adhesion film 210, the sensing film 300, and the adhesion layer AF may be substantially the same as those explained on the substrate 100, the first adhesion film 210, the sensing film 300, and the adhesion layer AF of FIG. 2A. However, the glass layer 400 is omitted, and the adhesion layer AF may be exposed outward. The adhesion layer AF has high strength and heat resistance, and thus may protect the sensing film 300.

Figure 2C:
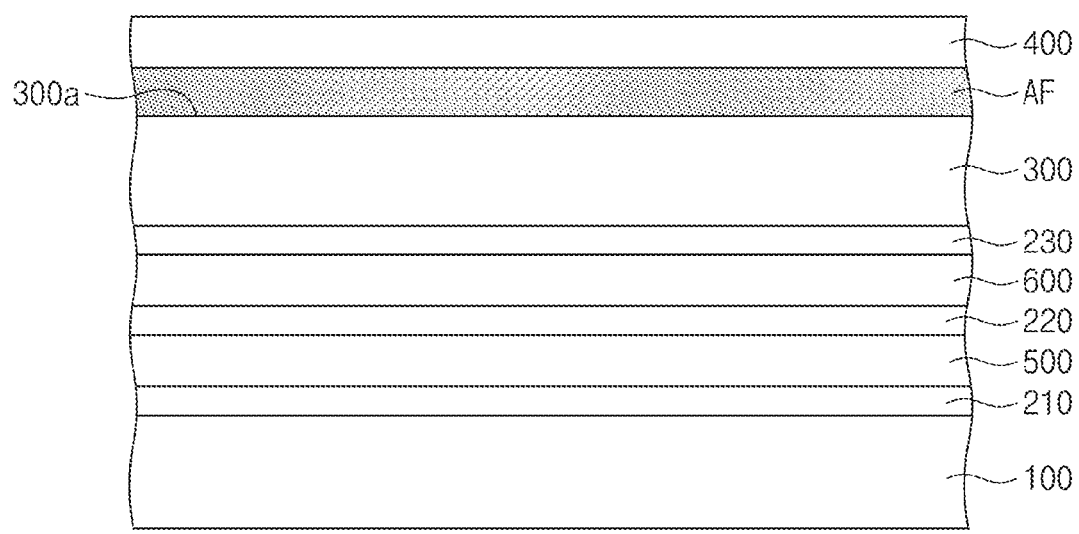
FIG. 2C is a cross-sectional view of a sensing device according to some example embodiments.

FIG. 2C is a cross-sectional view showing a sensing device according to some example embodiments. Hereinafter overlapping parts with the above-explanation will be omitted.

Referring to FIG. 2C, a sensing device 1002 may include a display device part 500, a second adhesion film 220, a polarization layer 600, and a third adhesion film 230 in addition to a substrate 100, a first adhesion film 210, a sensing film 300, an adhesion layer AF, and a glass layer 400. The substrate 100, the first adhesion film 210, the sensing film 300, the adhesion layer AF, and the glass layer 400 may be the same as described above. The sensing film 300 and the adhesion layer AF may be clear. The sensing device 1002 includes the display device part 500 and may achieve sensing function and display function.

The display device part 500 may be disposed on the first adhesion film 210. The display device 500 may be disposed between the substrate 100 and the sensing film 300. The display device part 500 may include an organic light emitting diode device, a field emission display (FED) device, or a plasma display panel (PDP) device. The display device part 500 may emit light. The light of the display device part 500 may be emitted outward through the second adhesion film 220, the polarization layer 600, the third adhesion film 230, the sensing film 300, the adhesion layer AF, and the glass layer 400. The polarization layer 600 may be disposed on the display device part 500. The polarization layer 600 may polarize the light emitted from the display device part 500.

The second adhesion film 220 may be disposed between the display device part 500 and the polarization layer 600. The second adhesion film 220 may include, for example, an optical clearance adhesive material. In other embodiments, the second adhesion film 220 may be prepared using the composition for adhesion according to some example embodiments. The forming method and curing method of the second adhesion film 220 may be substantially the same as explained in the preparation embodiment of the adhesion layer AF of FIG. 1. The second adhesion film 220 may be clear.

The third adhesion film 230 may be interposed between the polarization layer 600 and the sensing film 300. The third adhesion film 230 may include, for example, an optical clearance adhesive material. In other embodiments, the third adhesion film 230 may be prepared using the composition for adhesion according to some example embodiments. The forming method and curing method of the third adhesion film 230 may be substantially the same as those explained in the preparation embodiment of the adhesion layer AF of FIG. 1. The third adhesion film 230 may be clear.

Different from the drawing, the glass layer 400 may not be formed. In this case, the adhesion layer AF may be exposed outward.

Figure 4:
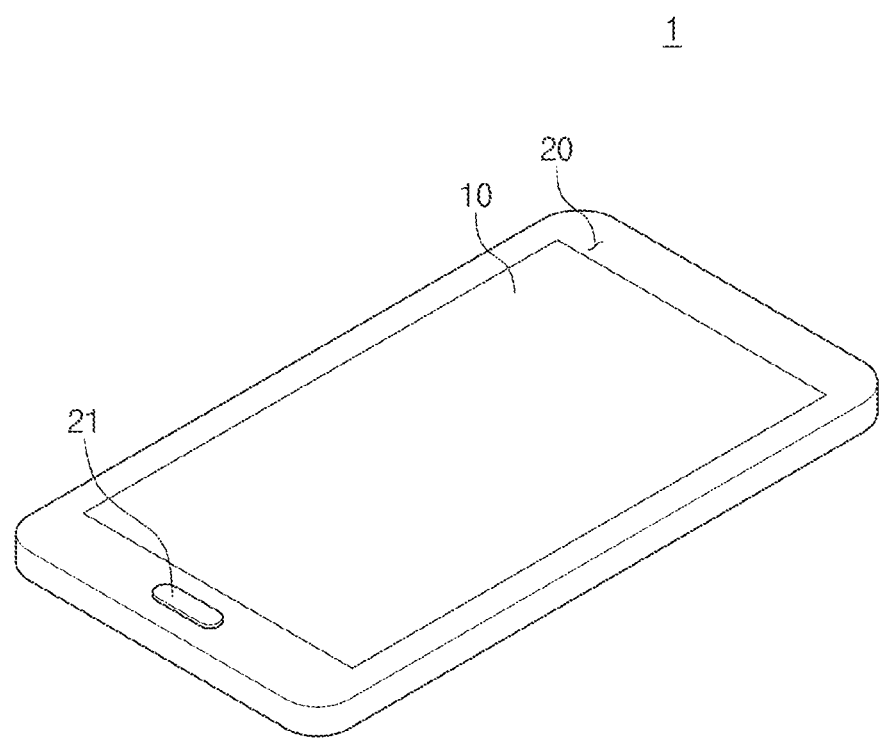
FIG. 4 is a perspective view showing a semiconductor device according to some example embodiments.

FIG. 4 is a perspective view showing a semiconductor device according to some example embodiments. Hereinafter overlapping parts with the above-explanation will be omitted.

Referring to FIG. 4, a semiconductor device 1 may include a display part 10 and a body part 20. The display part 10 may be substantially flat. The body part 20 may surround the display part 10. The display part 10 may include at least one of the sensing device 1000 of FIG. 2A, the sensing device 1001 of FIG. 2B, or the sensing device 1002 of FIG. 2C.

A touch button 21 may be disposed on the body part 20. The touch button 21 may include at least one of the sensing device 1000 of FIG. 2A, the sensing device 1001 of FIG. 2B, or the sensing device 1002 of FIG. 2C. In other embodiments, the touch button 21 may be omitted.

Figure 5A:
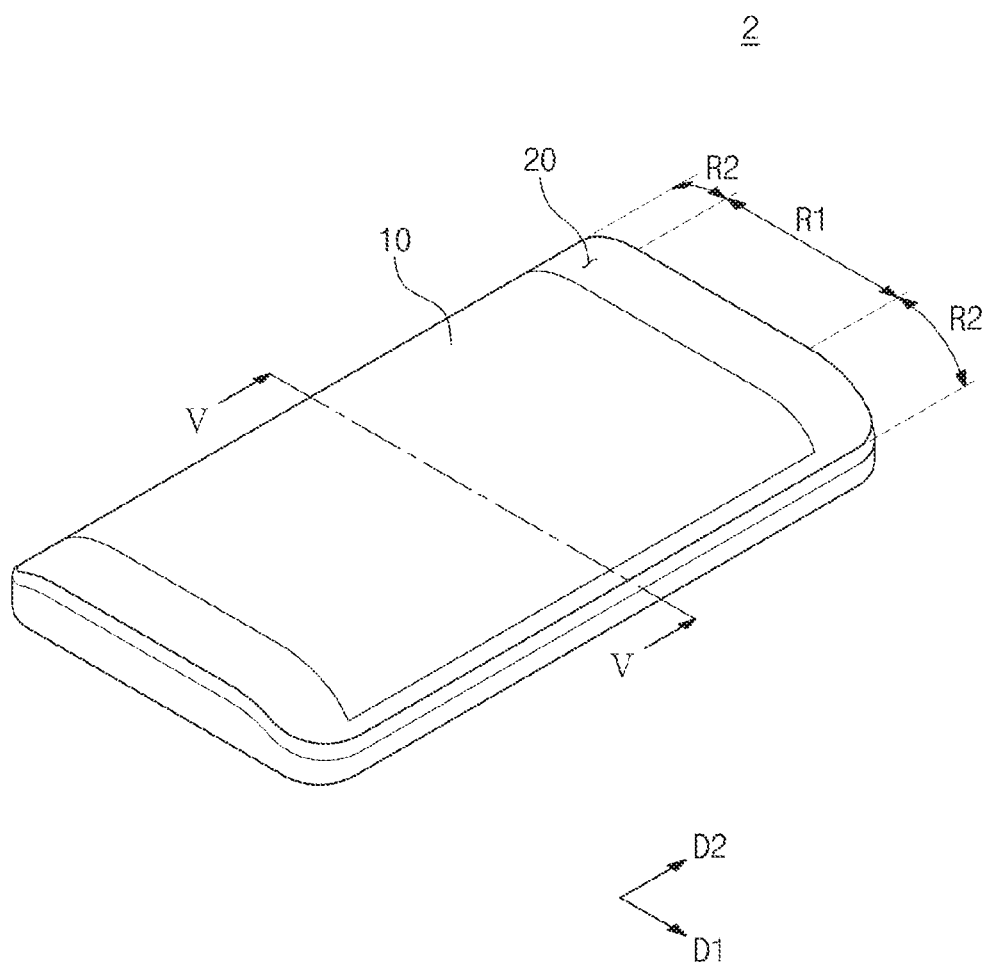
FIG. 5A is a perspective view showing a semiconductor device according to some example embodiments.
Figure 5B:
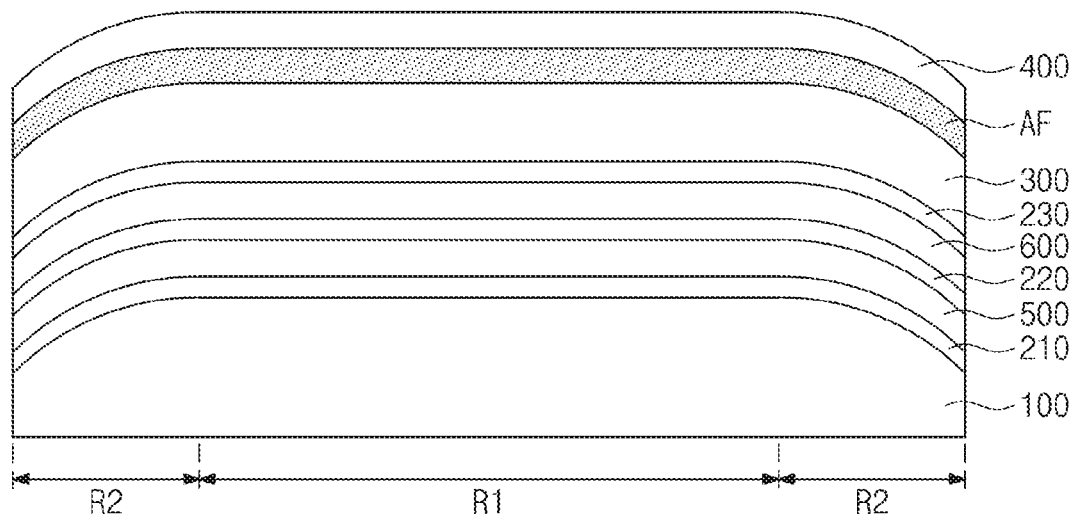
FIG. 5B is a cross-sectional view taken along line V-V of FIG. 5A.

FIG. 5A is a perspective view showing a semiconductor device according to some example embodiments. FIG. 5B is a cross-sectional view taken along line V-V of FIG. 5A. Hereinafter overlapping parts with the above-explanation will be omitted.

Referring to FIGS. 5A and 5B, a semiconductor device 2 may include a display part 10 and a body part 20. The semiconductor device 2 may have a flat area R1 and bent areas R2. The flat area R1 may be in parallel with a plane defined by a first direction D1 and a second direction D2. In the present disclosure, the first direction D1 and the second direction D2 may be in parallel to the bottom surface of the semiconductor device 2. However, the first direction D1 and the second direction D2 are relative concept and may be changed to other directions. The second direction D2 may intersect the first direction D1. The bent areas R2 may be connected with the flat area R1. The bent areas R2 may not be in parallel to the plane defined by the first direction D1 and the second direction D2. The bent areas R2 may be provided on both sides of the flat area R1. The disposition of the bent areas R2 is not limited thereto, and one of the bent areas R2 may be omitted.

The display part 10 may be provided on the flat area R1 and the bent areas R2. The display part 10 may include at least one of the sensing device 1000 of FIG. 2A, the sensing device 1001 of FIG. 2B, or the sensing device 1002 of FIG. 2C. In some embodiments, the display part 10 may include a substrate 100, a first adhesion film 210, a display device part 500, a second adhesion film 220, a polarization layer 600, a third adhesion film 230, a sensing film 300, an adhesion layer AF, and a glass layer 400 as in FIG. 5B. The display device part 500, the polarization layer 600, the sensing film 300, the adhesion layer AF, and the glass layer 400 may be provided on the flat area R1 and the bent areas R2. In other embodiments, the glass layer 400 may be omitted, and the adhesion layer AF may be exposed outward.

According to some example embodiments, the application of the sensing devices 1000, 1001, and 1002 is not limited to the semiconductor device 1 of FIG. 4 and the semiconductor device 2 of FIGS. 5A and 5B, but may be diverse. For example, the sensing devices 1000, 1001, and 1002 may be applied to a sensor for recognizing fingerprint/touch of an input apparatus such as a mouse and a keyboard, a sensor for recognizing fingerprint/touch installed on a laptop or a personal computer (PC), or a sensor for recognizing fingerprint/touch installed on home appliances such as a refrigerator.

Hereinafter, the preparation of a composition for adhesion will be explained in detail with reference to examples.
Preparation of Composition for Adhesion 1. Preparation of Acrylic Resin (Experimental Example 1)

40 g of butyl acrylate, 30 g of ethylhexyl acrylate, 20 g of isobornyl acrylate, 10 g of 2-hydroxyethyl methacrylate and 0.1 g of an initiator were added to a reactor to prepare a mixture solution. Dibenzoyl peroxide (DBPO) was used as the initiator. The mixture solution was stirred at about 60° C. for about 6 hours to prepare an acrylic resin.
1-2. Confirmation of the Preparation of Acrylic Resin
[Number Average Molecular Weight]

The weight average molecular weight of the acrylic resin was measured using gel permeation chromatography. The weight average molecular weight of the acrylic resin was measured as 171118.
[FT-IR Analysis]

The product was analyzed by a Fourier transform infrared spectroscopy using an infrared spectrometer. From the analysis results of the product, a 3- —OH peak were shown at about 3,500 cm$^{-1}$, a C=O peak was shown at about 1,730 cm$^{-1}$, a C=C peak was shown at about 1,630 cm$^{-1}$, a —CH$_2$ peak was shown at about 1,165 cm$^{-1}$, a —COO peak was shown at about 1,150 cm$^{-1}$, and a =CH$_2$ peak was shown at about 815 cm$^{-1}$.

2. Preparation and Confirmation of Silane Compound (Experimental Example 2)

(3-glycidyloxypropyl)trimethoxysilane (212.2 g) was dissolved in methanol (339.14 ml), and water (48.51 g) and hydrochloric acid (1.4 g) were added to methanol to prepare a mixture solution. The mixture solution was stirred at room temperature (25° C.) for about 48 hours to prepare a condensate. Then, the condensate was distilled under a reduced pressure to obtain a silane compound.

[Weight Average Molecular Weight]

The weight average molecular weight of the silane compound was measured using gel permeation chromatography. The weight average molecular weight of the silane compound was measured as 1,569 g/mol.

[Nuclear Magnetic Resonance (NMR) Analysis]

The silane compound thus synthesized was analyzed by proton nuclear magnetic resonance. Each peak was observed at 2.21 ppm, 2.38 ppm, 2.74 ppm, 1.27 ppm, and 0.22 ppm.

3. Preparation of Composition for Adhesion (Experimental Example 3)

The acrylic resin of Experimental Example 1, the silane compound of Experimental Example 2, and silica nanoparticles were mixed to prepare a composition for adhesion. As the silica nanoparticles, NANOBYK-3530 of BYK Co., Ltd. was used.

4. Evaluation of Properties of Composition for Adhesion

Comparative Example 1

A ball of 22 g was dropped on a glass layer with a thickness of 0.3 mm by changing the height. The minimum height when the glass layer was broken was measured. In this case, the height means a height of the ball from the glass layer.

Experimental Example 4

On one surface of the glass layer, the acrylic resin prepared in Experimental Example 1 was coated to a thickness of about 30 μm. A ball of 22 g was dropped on the glass layer by changing the height. The minimum height when the glass layer was broken was measured.

Experimental Example 5

On one surface of the glass layer, the composition for adhesion prepared in Experimental Example 3 was coated to a thickness of about 30 μm. A ball of 22 g was dropped on the glass layer by changing the height. The minimum height when the glass layer was broken was measured.

Table 1 shows the results obtained by measuring the minimum breaking heights in Comparative Example 1, Experimental Example 4, and Experimental Example 5.

TABLE 1

| | Comparative Example 1 | Experimental Example 4 | Experimental Example 5 |
|---|---|---|---|
| Minimum breaking height | 5 cm | 15 cm | 40 cm |

Referring to Table 1, the minimum breaking height of Experimental Example 4 and Experimental Example 5 is greater than Comparative Example 1.

According to inventive concepts, a composition for adhesion may be cured to form an adhesion layer. The composition for adhesion may include a silane compound and silica nanoparticles, and the adhesion layer may absorb external stress. According to some example embodiments, a sensing film of an electronic device may be protected from external stress by the adhesion layer. The electronic device includes the adhesion layer and may be minimized.

According to some example embodiments, a composition for adhesion has strong adhesive force with an organic material and an inorganic material, and thus, an inorganic layer (for example, glass layer) may be firmly combined with an organic layer (for example, sensor film) by the composition for adhesion.

Although some example embodiments of inventive concepts have been described, it is understood that various changes and modifications can be made by one ordinary skilled in the art without departing from the spirit and scope of inventive concepts as set forth in the following claims.

What is claimed is:

1. A composition for adhesion, comprising:
an acrylic resin, the acrylic resin having a weight average molecular weight of about 100,000 g/mol to about 200,000 g/mol, the acrylic resin including a polymerization unit derived from a monomer represented by Formula A1 and a polymerization unit derived from a monomer represented by Formula A2,

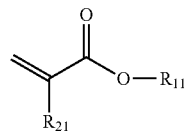

[Formula A1]

in Formula A1,
$R_{11}$ is a hydroxyalkyl group of 1 to 6 carbon atoms, and
$R_{21}$ is hydrogen, deuterium, or an alkyl group of 1 to 3 carbon atoms,

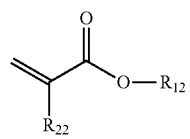

[Formula A2]

in Formula A2,
$R_{12}$ is an alkyl group of 1 to 6 carbon atoms, and
$R_{22}$ is hydrogen, deuterium, or an alkyl group of 1 to 3 carbon atoms; and
a silane compound, the silane compound having a weight average molecular weight of about 300 g/mol to about 2,000 g/mol, the silane compound including a polymerization unit derived from a monomer represented by Formula B,

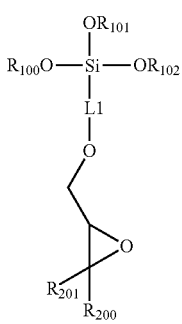

[Formula B]

in Formula B,
$R_{100}$, $R_{101}$, and $R_{102}$ are each independently an alkyl group of 1 to 6 carbon atoms,
$R_{200}$ and $R_{201}$ are each independently one of hydrogen, deuterium or an alkyl group of 1 to 3 carbon atoms, and
$L_1$ is a single bond or an alkyl group of 1 to 4 carbon atoms.

2. The composition for adhesion of claim 1, wherein the acrylic resin further includes at least one of a polymerization unit derived from a monomer represented by Formula A3 or a polymerization unit derived from a monomer represented by Formula A4,

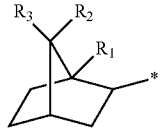

[Formula A3]

in Formula A3,
$R_{13}$ is a bicyclic alkyl group of 5 to 15 carbon atoms, and
$R_{23}$ is hydrogen, deuterium or an alkyl group of 1 to 3 carbon atoms,

[Formula A4]

in Formula A4,
$R_{14}$ is an alkyl group of 1 to 6 carbon atoms, and
$R_{24}$ is hydrogen, deuterium, or an alkyl group of 1 to 3 carbon atoms, and
$R_{14}$ of Formula A4 is a different group from $R_{11}$ of Formula A1.

3. The composition for adhesion of claim 2, wherein the acrylic resin is represented by Formula 3,

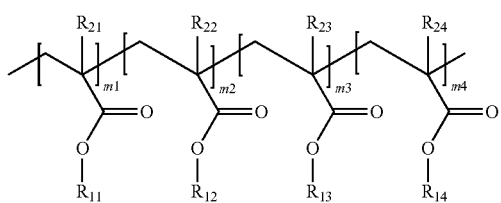

[Formula 3]

in Formula 3,
one of $R_{11}$, $R_{12}$, $R_{13}$ or $R_{14}$ is a hydroxyalkyl group of 1 to 6 carbon atoms,
an other one of $R_{11}$, $R_{12}$, $R_{13}$ or $R_{14}$ is an alkyl group of 1 to 6 carbon atoms,
a different one of $R_{11}$, $R_{12}$, $R_{13}$ or $R_{14}$ is a bicyclic alkyl group of 5 to 15 carbon atoms, and
a remaining one of $R_{11}$, $R_{12}$, $R_{13}$ or $R_{14}$ is an alkyl group of 1 to 6 carbon atoms,
$R_{21}$, $R_{22}$, $R_{23}$ and $R_{24}$ are each independently one of hydrogen, deuterium or an alkyl group of 1 to 3 carbon atoms, and
m1, m2, m3, and m4 are each independently an integer in a range greater than or equal to 1 and less than or equal 2,000.

4. The composition for adhesion of claim 2, wherein $R_{13}$ in Formula A3 is represented by Formula A5,

[Formula A5]

in Formula A5,
$R_1$, $R_2$, and $R_3$ are each independently one of hydrogen, deuterium, or an alkyl group of 1 to 3 carbon atoms, and
* is a part combined with O of Formula A3.

5. The composition for adhesion of claim 1, wherein the silane compound is represented by Formula 4,

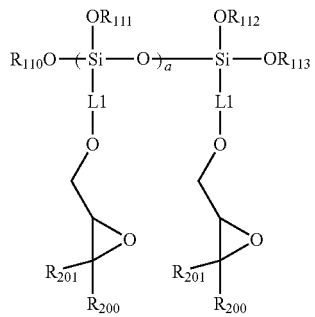

[Formula 4]

in Formula 4,
$R_{110}$, $R_{111}$, $R_{112}$, and $R_{113}$ are each independently an alkyl group of 1 to 6 carbon atoms,
$L_1$ is a single bond or an alkyl group of 1 to 4 carbon atoms, and
a is an integer of 1 to 6.

6. The composition for adhesion of claim 1, further comprising:
silica nanoparticles.

7. The composition for adhesion of claim 6, wherein
a weight ratio of the silane compound to the silica nanoparticles is from about 1:0.3 to about 1:3, and
a weight ratio of the acrylic resin to a total amount of the silane compound and the silica nanoparticles is from about 1:1 to about 1:9.

8. The composition for adhesion of claim 1, wherein the acrylic resin is represented by Formula 1,

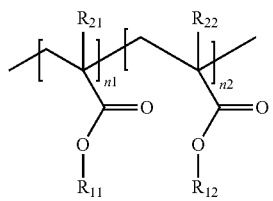
[Formula 1]

in Formula 1,
- $R_{11}$ is a hydroxyalkyl group of 1 to 6 carbon atoms,
- $R_{12}$ is an alkyl group of 1 to 6 carbon atoms,
- $R_{21}$ and $R_{22}$ are each independently one of hydrogen, deuterium or an alkyl group of 1 to 3 carbon atoms, and
- n1 and n2 are each independently an integer in a range greater than or equal to 1 and less than or equal 2,000.

9. A composition for adhesion, comprising:
an acrylic resin, the acrylic resin including a polymerization unit represented by Formula 1,

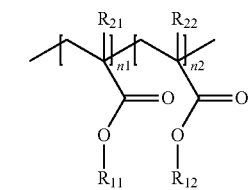
[Formula 1]

in Formula 1,
- $R_{11}$ is a hydroxyalkyl group of 1 to 6 carbon atoms,
- $R_{12}$ is an alkyl group of 1 to 6 carbon atoms,
- $R_{21}$ and $R_{22}$ are each independently one of hydrogen, deuterium or an alkyl group of 1 to 3 carbon atoms, and
- n1 and n2 are each independently an integer in a range greater than or equal to 1 and less than or equal 2,000; and a silane compound represented by Formula 4,

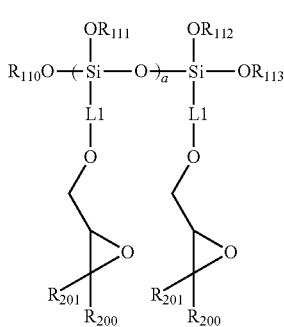
[Formula 4]

in Formula 4,
- $R_{110}$, $R_{111}$, $R_{112}$, and $R_{113}$ are each independently an alkyl group of 1 to 6 carbon atoms,
- $R_{200}$ and $R_{201}$ are each independently one of hydrogen, deuterium, or an alkyl group of 1 to 3 carbon atoms,
- $L_1$ is a single bond or an alkyl group of 1 to 4 carbon atoms, and
- a is an integer of 1 to 6.

10. The composition for adhesion of claim 9, wherein the acrylic resin further includes at least one of a polymerization unit represented by Formula 2-1 or a polymerization unit represented by Formula 2-2,

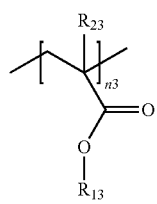
[Formula 2-1]

in Formula 2-1,
- $R_{13}$ is a bicyclic alkyl group of 5 to 15 carbon atoms,
- $R_{23}$ is hydrogen, deuterium, or an alkyl group of 1 to 3 carbon atoms, and
- n3 is an integer in a range greater than or equal to 1 and less than or equal 2,000,

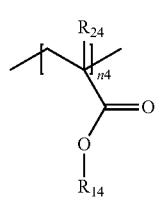
[Formula 2-2]

in Formula 2-2,
- $R_{14}$ is an alkyl group of 1 to 6 carbon atoms,
- $R_{24}$ is hydrogen, deuterium, or an alkyl group of 1 to 3 carbon atoms, and
- n4 is an integer in a range greater than or equal to 1 and less than or equal 2,000.

11. The composition for adhesion of claim 9, further comprising:
silica nanoparticles.

12. An electronic device, comprising:
a substrate;
a sensing film on the substrate; and
an adhesion layer on the sensing film, the adhesion layer including a cured product of the composition for adhesion according to claim 1.

13. The electronic device of claim 12, further comprising:
a glass layer on the adhesion layer, wherein
the adhesion layer is in physical contact with the sensing film and the glass layer.

14. The electronic device of claim 12, wherein
the acrylic resin further includes at least one of a polymerization unit derived from a monomer represented by Formula A3 or a polymerization unit derived from a monomer represented by Formula A4,

[Formula A3]

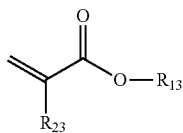

in Formula A3,
$R_{13}$ is a bicyclic alkyl group of 5 to 15 carbon atoms, and
$R_{23}$ is hydrogen, deuterium, or an alkyl group of 1 to 3 carbon atoms,

[Formula A4]

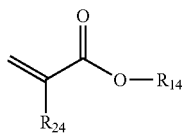

in Formula A4,
$R_{14}$ is an alkyl group of 1 to 6 carbon atoms, and
$R_{24}$ is hydrogen, deuterium, or an alkyl group of 1 to 3 carbon atoms.

15. The electronic device of claim 14, wherein $R_{13}$ in Formula A3 is isobornyl.

16. The electronic device of claim 12, further comprising silica nanoparticles,
wherein a weight ratio of the silane compound to the silica nanoparticles range from about 1:0.3 to about 1:3, and
wherein a weight ratio of the acrylic resin to a total amount of the silane compound and the silica nanoparticles range from about 1:1 to about 1:9.

17. The electronic device of claim 12, wherein the sensing film includes an insulating polymer.

18. The electronic device of claim 12, further comprising:
a display device part between the substrate and the sensing film;
a first adhesion film between the substrate and the display device part; and
a second adhesion film between the display device part and the first adhesion film,
wherein at least one of the first adhesion film or the second adhesion film includes the cured product of the composition for adhesion.

19. A stacked structure, comprising:
a substrate;
an organic layer on the substrate;
an inorganic layer on the organic layer; and
an adhesion layer between the organic layer and the inorganic layer, the adhesion layer include a cured product of a composition for adhesion according to claim 9.

20. A stacked structure, comprising:
a substrate;
an organic layer on the substrate;
an inorganic layer on the organic layer; and
an adhesion layer between the organic layer and the inorganic layer, the adhesion layer includes a cured product of a composition for adhesion according to claim 10, wherein
$R_{13}$ in Formula 2-1 is represented by Formula A5,

[Formula A5]

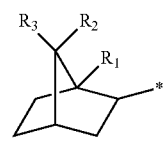

in Formula A5,
$R_1$, $R_2$, and $R_3$ are each independently one of hydrogen, deuterium or an alkyl group of 1 to 3 carbon atoms,
* is a part combined with O of Formula 2-1.

* * * * *